US012165921B2

(12) United States Patent
Sarile, Jr. et al.

(10) Patent No.: US 12,165,921 B2
(45) Date of Patent: Dec. 10, 2024

(54) WAFER ADAPTOR FOR ADAPTING DIFFERENT SIZED WAFERS

(71) Applicant: UTAC Headquarters Pte. Ltd., Singapore (SG)

(72) Inventors: Enrique Sarile, Jr., Singapore (SG); Chee Kay Chow, Singapore (SG); Dzafir Bin Mohd Shariff, Singapore (SG)

(73) Assignee: UTAC Headquarters Ptd. Ltd., Singapore (SG)

( * ) Notice: Subject to any disclaimer, the term of this patent is extended or adjusted under 35 U.S.C. 154(b) by 267 days.

(21) Appl. No.: 17/723,413

(22) Filed: Apr. 18, 2022

(65) Prior Publication Data

US 2022/0331917 A1    Oct. 20, 2022

Related U.S. Application Data

(60) Provisional application No. 63/175,571, filed on Apr. 16, 2021, provisional application No. 63/175,560, filed on Apr. 16, 2021.

(51) Int. Cl.
| | |
|---|---|
| *H01L 21/78* | (2006.01) |
| *B23Q 1/03* | (2006.01) |
| *H01J 37/32* | (2006.01) |
| *H01L 21/67* | (2006.01) |
| *H01L 21/683* | (2006.01) |

(52) U.S. Cl.
CPC ............... *H01L 21/78* (2013.01); *B23Q 1/03* (2013.01); *H01J 37/32715* (2013.01); *H01L 21/67092* (2013.01); *H01L 21/6836* (2013.01)

(58) Field of Classification Search
CPC ................................ G03F 7/707; B23Q 1/03
See application file for complete search history.

(56) References Cited

U.S. PATENT DOCUMENTS

| | | | | |
|---|---|---|---|---|
| 3,977,955 | A * | 8/1976 | Nevis | H01L 21/32131 |
| | | | | 204/298.31 |
| 5,513,594 | A * | 5/1996 | McClanahan | H01L 21/68735 |
| | | | | 269/254 R |
| 8,746,666 | B2 * | 6/2014 | Hertel | H01L 21/68771 |
| | | | | 414/935 |
| 9,385,017 | B2 * | 7/2016 | Fazio | H01L 21/68771 |
| D867,867 | S * | 11/2019 | Tenander | D8/394 |
| 2017/0352566 | A1 * | 12/2017 | Ramaswamy | H01J 37/32706 |
| 2018/0090401 | A1 * | 3/2018 | Mohn | H01L 24/01 |
| 2019/0096733 | A1 * | 3/2019 | Amano | H01L 21/68735 |
| 2020/0273596 | A1 * | 8/2020 | Mori | H01R 11/01 |

* cited by examiner

*Primary Examiner* — Lee D Wilson
(74) *Attorney, Agent, or Firm* — HORIZON IP PTE LTD.

(57) ABSTRACT

A wafer adaptor ring assembly for adapting an adapted sized wafer for plasma dicing by a plasma etch chamber designed for dicing a designed sized wafer, which is larger than the adapted sized wafer is disclosed. The wafer adaptor ring assembly includes a primary wafer ring designed for plasma dicing the designed sized wafer by the plasma, an adhesive sheet attached to a bottom surface of the primary wafer ring, and an adapted sized wafer disposed on the adhesive sheet between the primary wafer ring and the adapted sized wafer. A method for forming the wafer adaptor ring assembly is also disclosed.

20 Claims, 12 Drawing Sheets

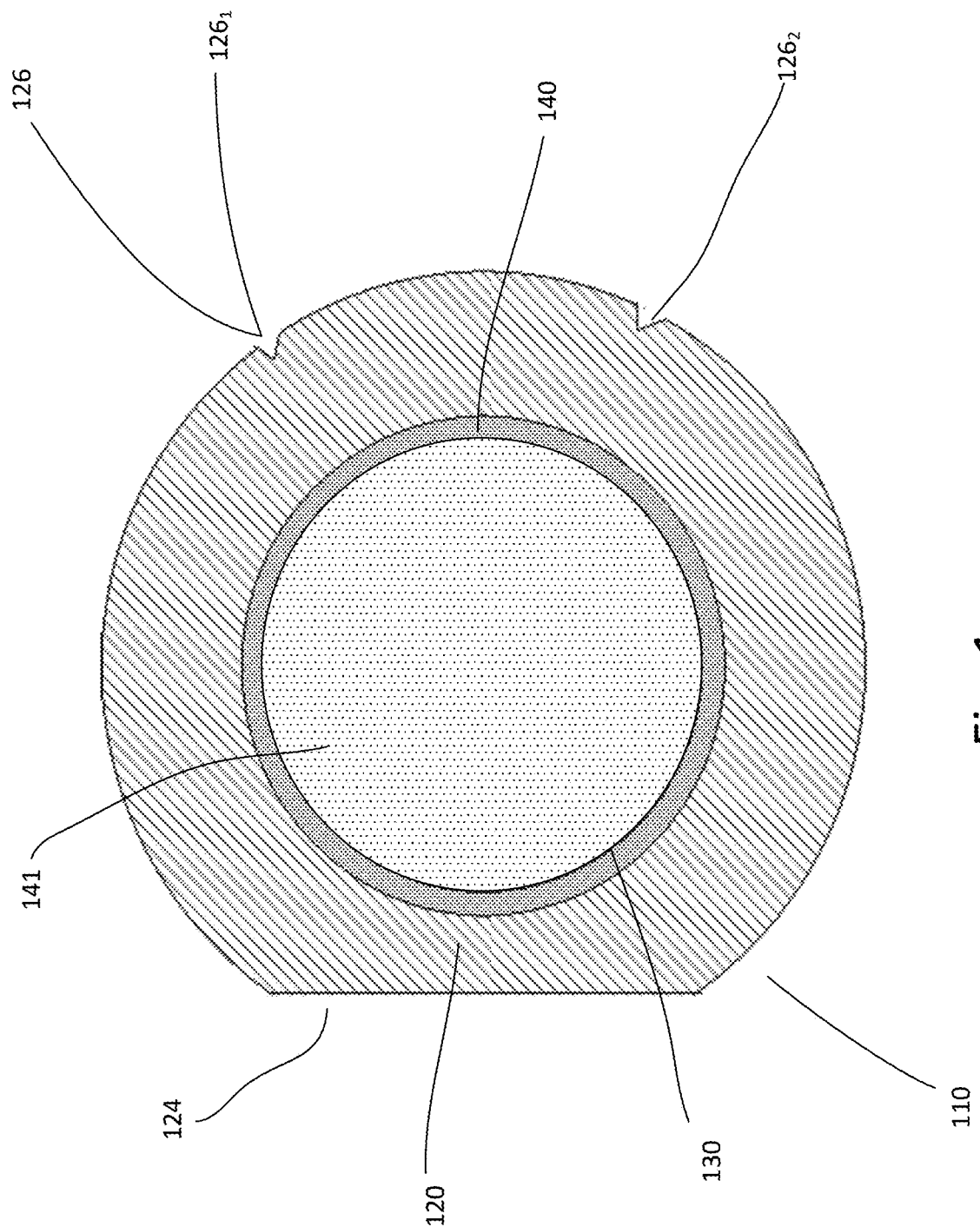

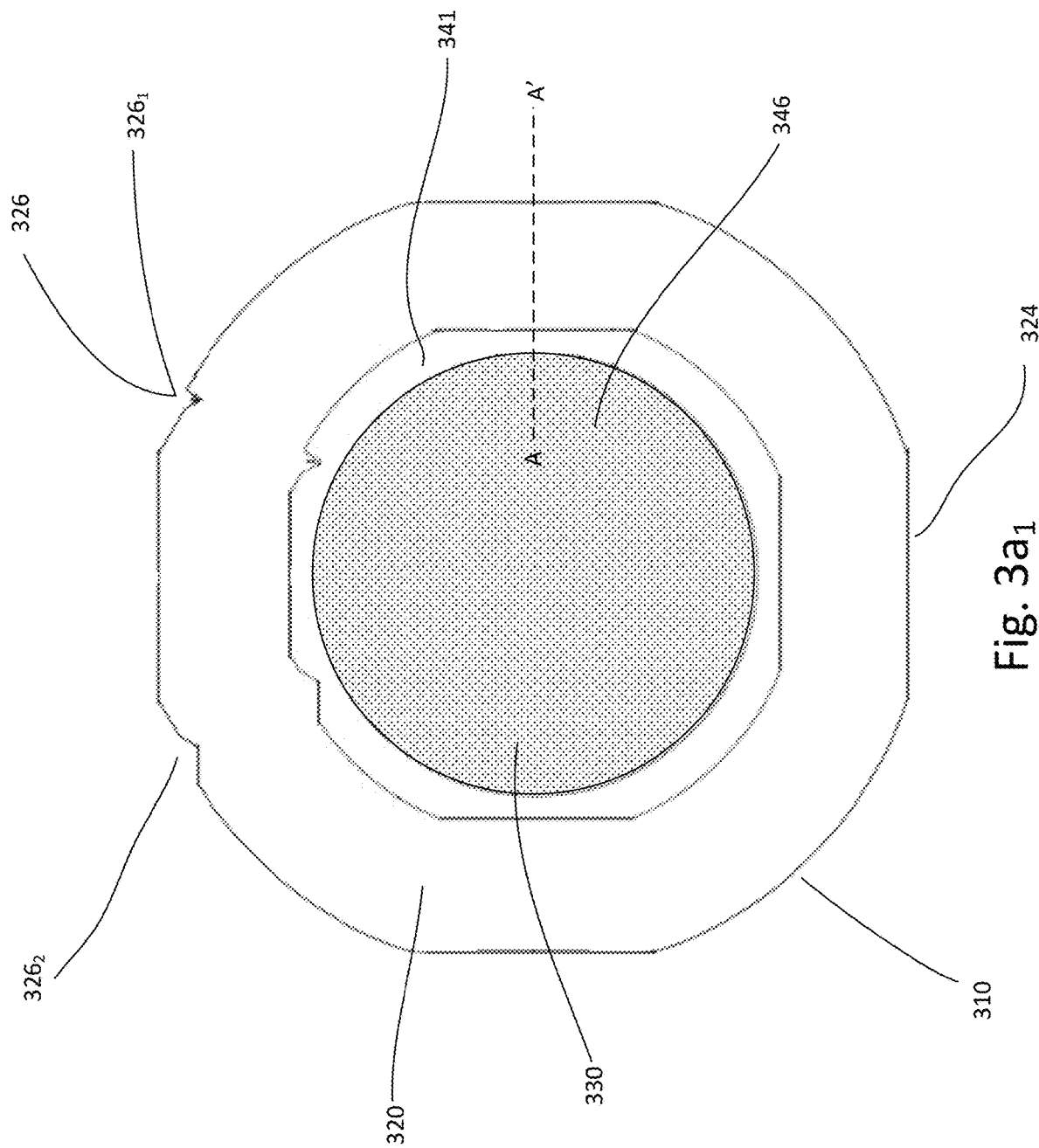

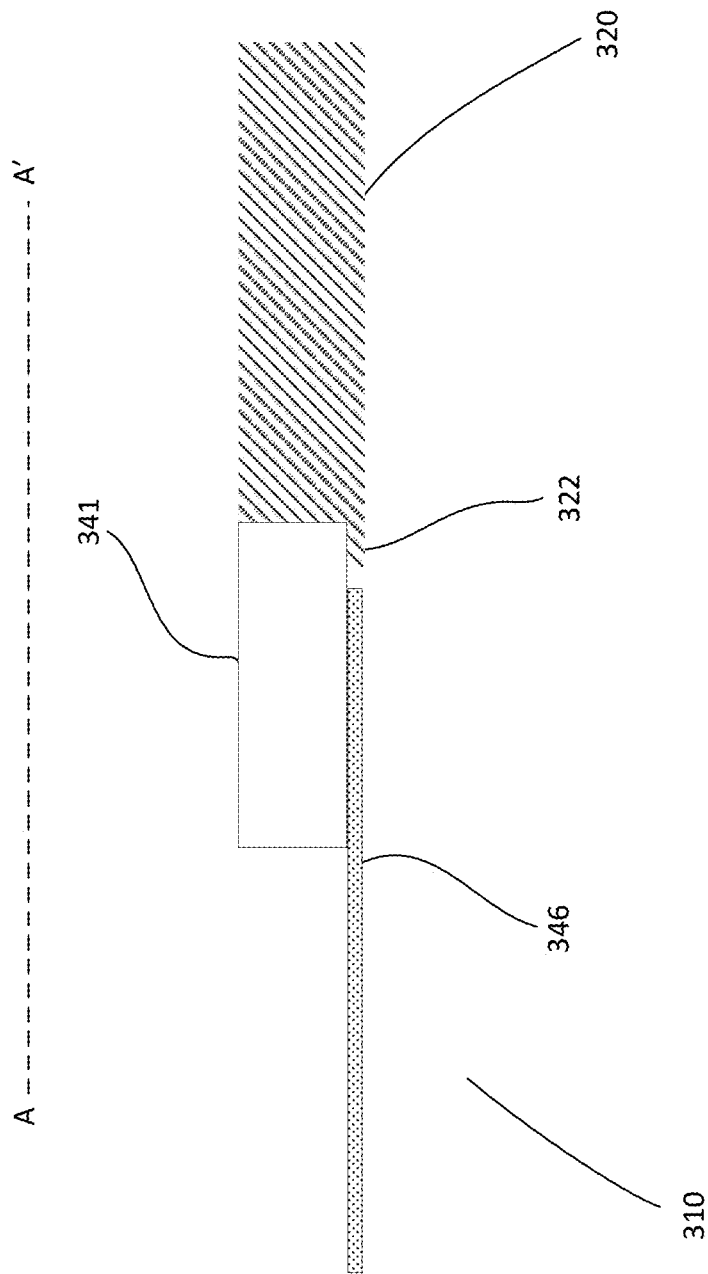

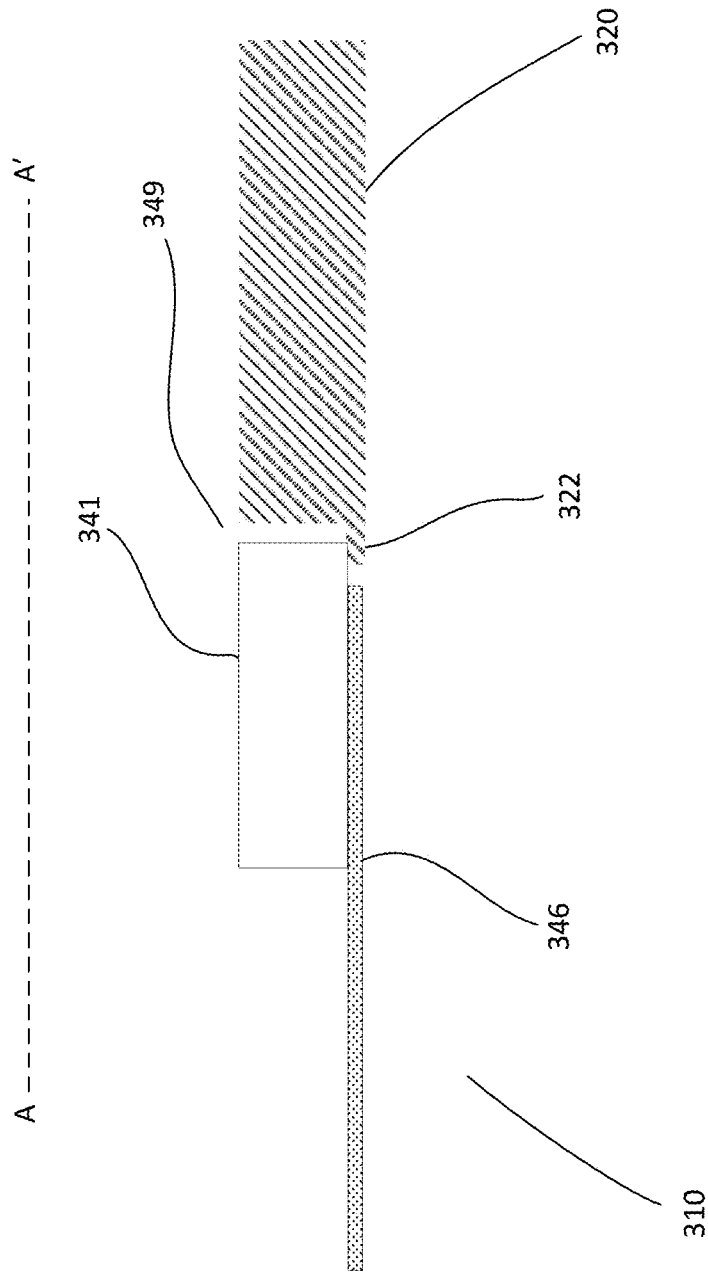
Fig. 3a₃

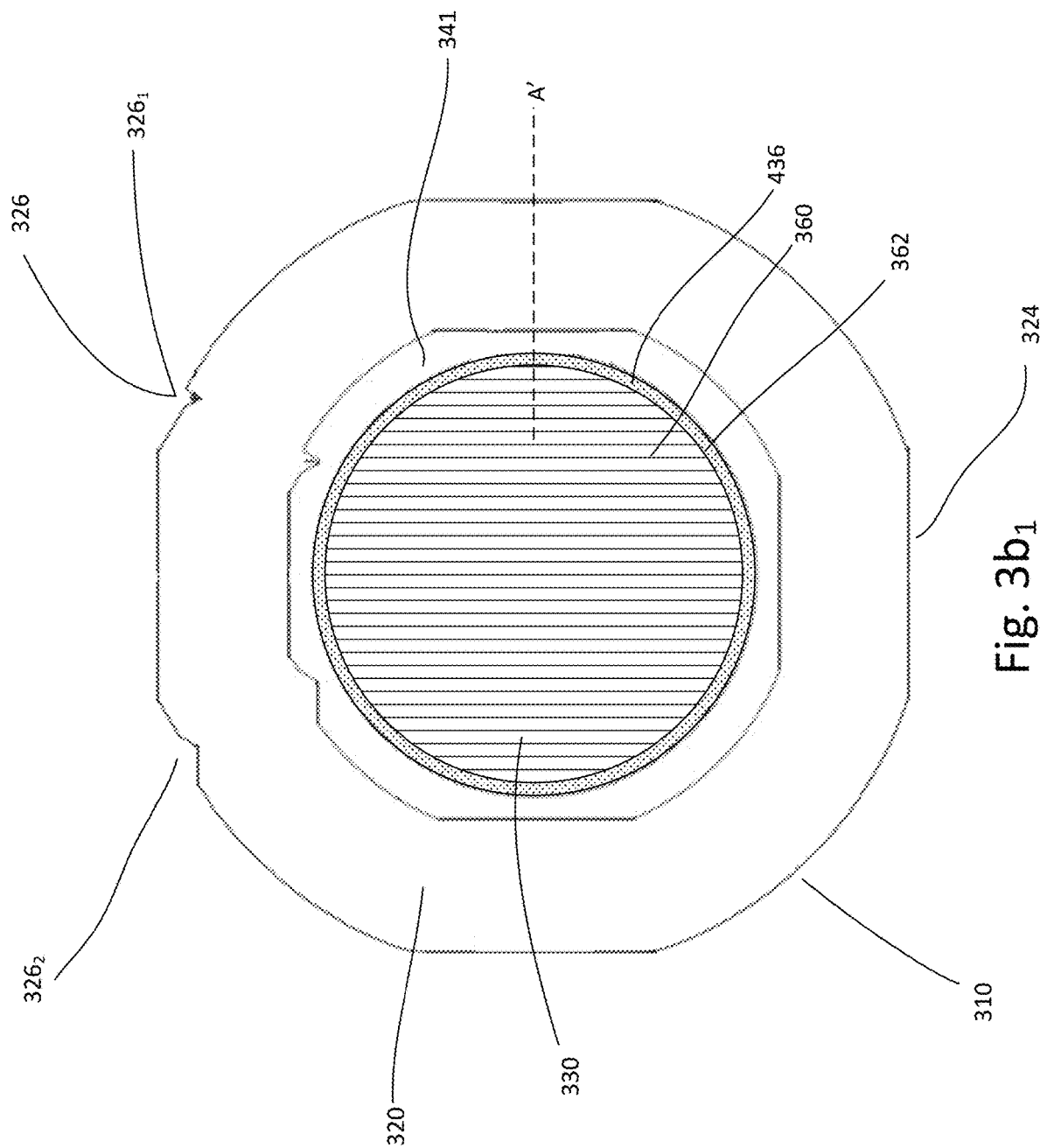

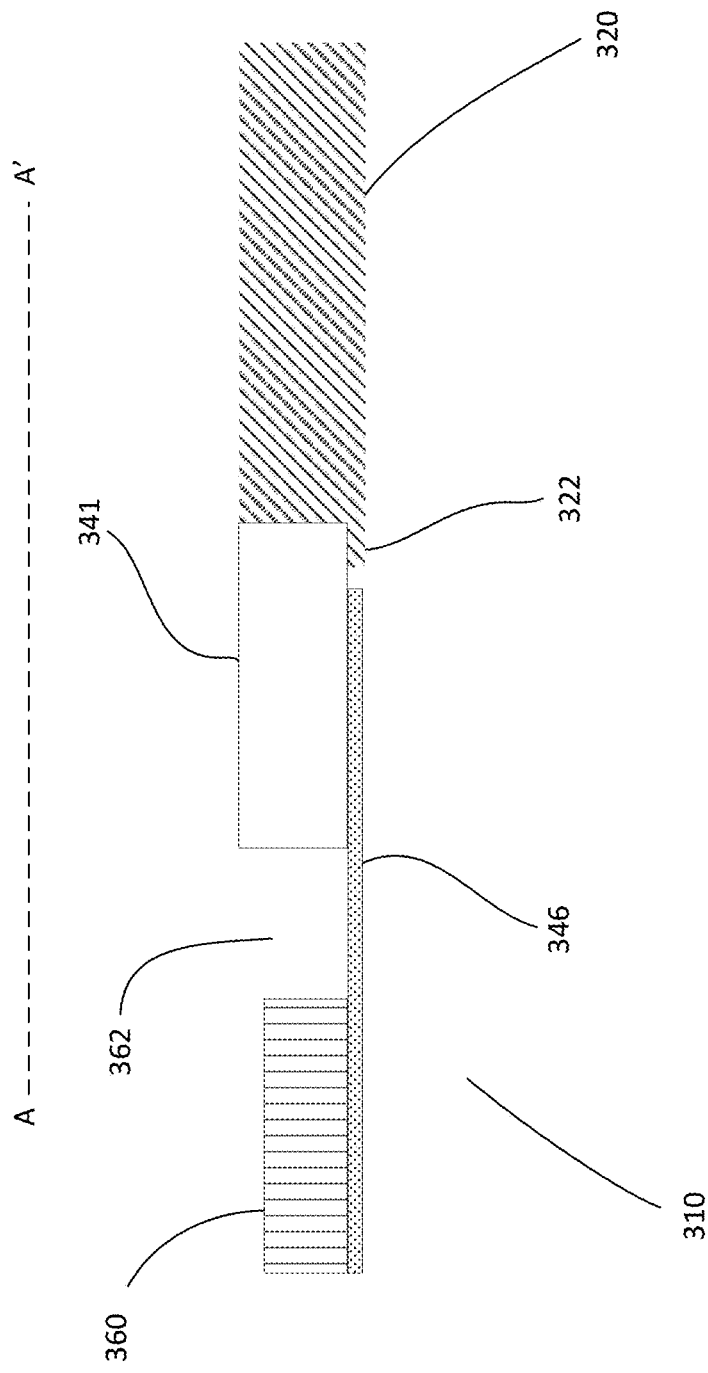
Fig. 3b₂

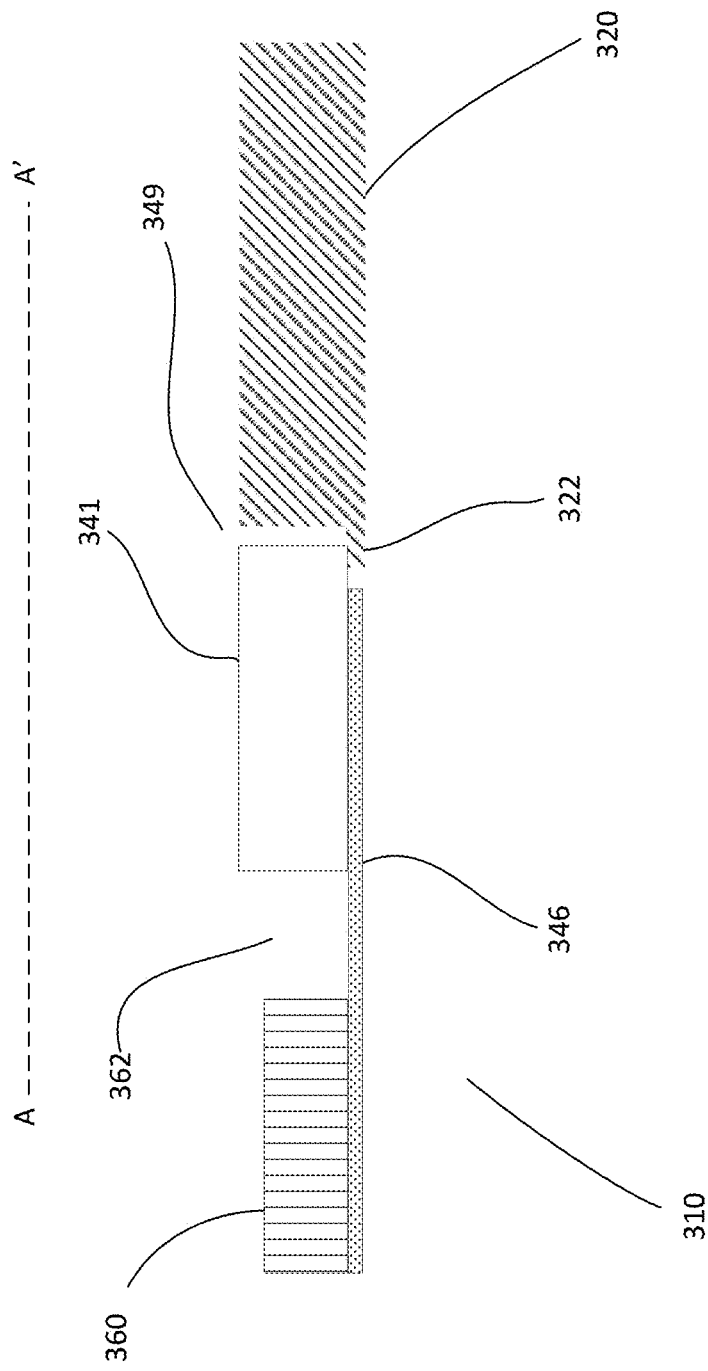
Fig. 3b₃

WAFER ADAPTOR FOR ADAPTING DIFFERENT SIZED WAFERS

CROSS-REFERENCE TO RELATED APPLICATION

This application claims the benefit of U.S. Provisional Application Ser. No. 63/175,560, filed on Apr. 16, 2021, and U.S. Provisional Application Ser. No. 63/175,571, filed on Apr. 16, 2021. This application also cross-references to concurrently filed U.S. patent application Ser. No. 17/722,416, titled wafer adaptors, including systems and methods, for adapting different sized wafers. All applications are incorporated by reference in their entirety for all purposes.

FIELD OF THE INVENTION

The present disclosure generally relates to a plasma processing (etching) of semiconductor wafers. More specifically, the present disclosure is directed to wafer adaptors and systems for utilizing wafer adaptors for adapting different sized wafers for plasma processing, such as plasma dicing. The wafer adaptors and systems may be may be employed for other types of processing.

BACKGROUND

In semiconductor processing, a wafer is processed to form a plurality of devices thereon. After the devices are formed, the wafer is diced to separate the devices into individual dies. Conventional techniques for dicing employ the use of a dicing saw. The saw dices the wafer along x and y saw lines, one at a time, to separate the wafer into individual dies. Sawing, however, takes time, which slows down the processing throughput. In addition, sawing may cause cracks in the dies which may impact yields negatively.

To combat the issues of sawing, plasma dicing has been employed. Plasma dicing entails mounting a wafer onto a wafer ring and inserting the wafer ring with the wafer into a plasma chamber for etching. Unlike mechanical sawing, the plasma etch process singulates the wafer into individual dies in a single etch step. This significantly improves throughput. In addition, plasma dicing avoids vibration which may cause cracking in the dies.

However, plasma chambers are specifically designed to etch a wafer of a specific size. When other sized wafers are etched, new plasma chambers need to be purchased. Plasma chambers are very expensive, for example, in the range of millions of dollars per chamber. In addition, purchasing a plasma chamber requires a long lead time, which results in delays.

The present disclosure is directed to wafer adaptors which can be used to adapt a wafer ring to accommodate different sized wafers for plasma processing using the same plasma etch chamber. The wafer adaptors may be employed for other types of processing.

SUMMARY

Wafer adaptors, including systems and methods thereof, are disclosed. In one embodiment, a wafer adaptor ring assembly for adapting an adapted sized wafer for processing in processes designed for processing a designed sized wafer which is larger than the adapted size wafer is disclosed. The ring assembly includes a primary ring having inner and outer primary ring edges. The outer primary ring edge defines a shape of the primary ring and the inner primary ring edge defines a primary ring opening. The primary ring is designed to accommodate the designed sized wafer within the primary ring opening. The ring assembly also includes an adaptor ring disposed within at least a circumference of the primary ring opening. The adaptor ring is configured to accommodate the adapted sized wafer which is smaller than the designed sized wafer. The ring assembly further includes an adhesive sheet. The adhesive sheet is attached to a bottom adaptor ring surface and is disposed in the adaptor ring opening. The adaptor ring is configured to enable processing of an adapted sized wafer in processes designed for dicing the designed sized wafer.

In another embodiment, a method for assembling an adaptor ring assembly includes providing a primary ring with an adhesive tape attached to a bottom surface of the primary ring. The adhesive sheet is disposed in a primary ring opening of the primary ring. The method also includes attaching an adaptor ring on the adhesive tape in the primary ring opening. The method further includes aligning an adapted sized wafer to the adaptor ring.

In yet another embodiment, a method for assembling an adaptor ring assembly includes providing an adaptor ring, wherein the adaptor ring includes an adaptor ring opening and an adhesive sheet attached to a bottom surface of the adaptor ring. The adhesive sheet is disposed within the adaptor ring opening. The method also includes aligning an adapted sized wafer to the adaptor ring opening and attaching the aligned adapted sized wafer to the adhesive sheet to form an adaptor ring sub-assembly. The method further includes aligning the adaptor ring sub-assembly to a primary ring to form the wafer adaptor ring assembly.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-1b show simplified top views of an embodiment of a wafer adaptor ring assembly with and without a wafer;

Figure 4:
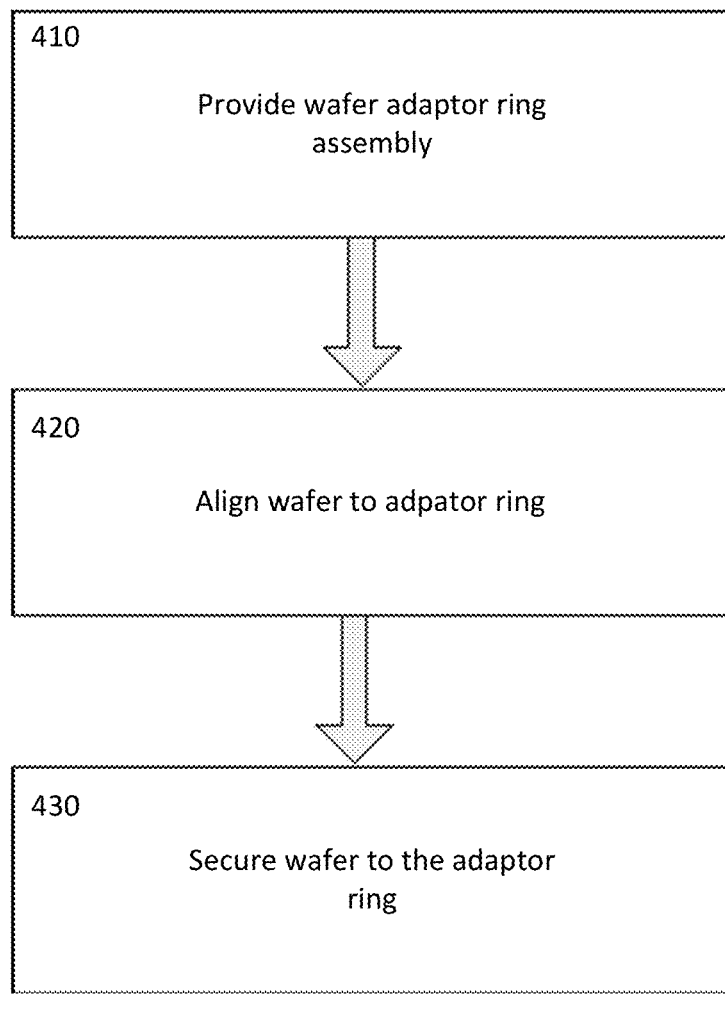

FIG. $3a_1$ shows a simplified top view of a wafer ring assembly without a wafer;

FIG. $3a_{2-3}$ show simplified cross-sectional views of embodiments of a wafer adaptor ring assembly without a wafer across A-A';

FIG. $3b_1$ shows a simplified top view of a wafer ring assembly with a wafer;

FIG. $3b_{2-3}$ show simplified cross-sectional views of embodiments of a wafer adaptor ring assembly with a wafer across A-A'; and FIG. 4 shows an embodiment of a simplified process flow for mounting a wafer to a wafer ring adaptor assembly.

DETAILED DESCRIPTION

Embodiments relate to wafer adaptors and systems for utilizing wafer adaptors for adapting different sized wafers for plasma processing, such as plasma etching or dicing. Wafer adaptors result in significant cost savings by avoiding the need to have different plasma dicing tools configured for different sized wafers. It is to be understood that the wafer adaptors and systems for utilizing wafer adaptors for adapting different sized wafers described herein may also be applied in other processes, such as the processes after plasma dicing, including but not limited to tape cutting, Automated Optical Inspection (AOI), and Tape and Reel machines processes, which involve processing wafers on a wafer ring.

Figure 1B:
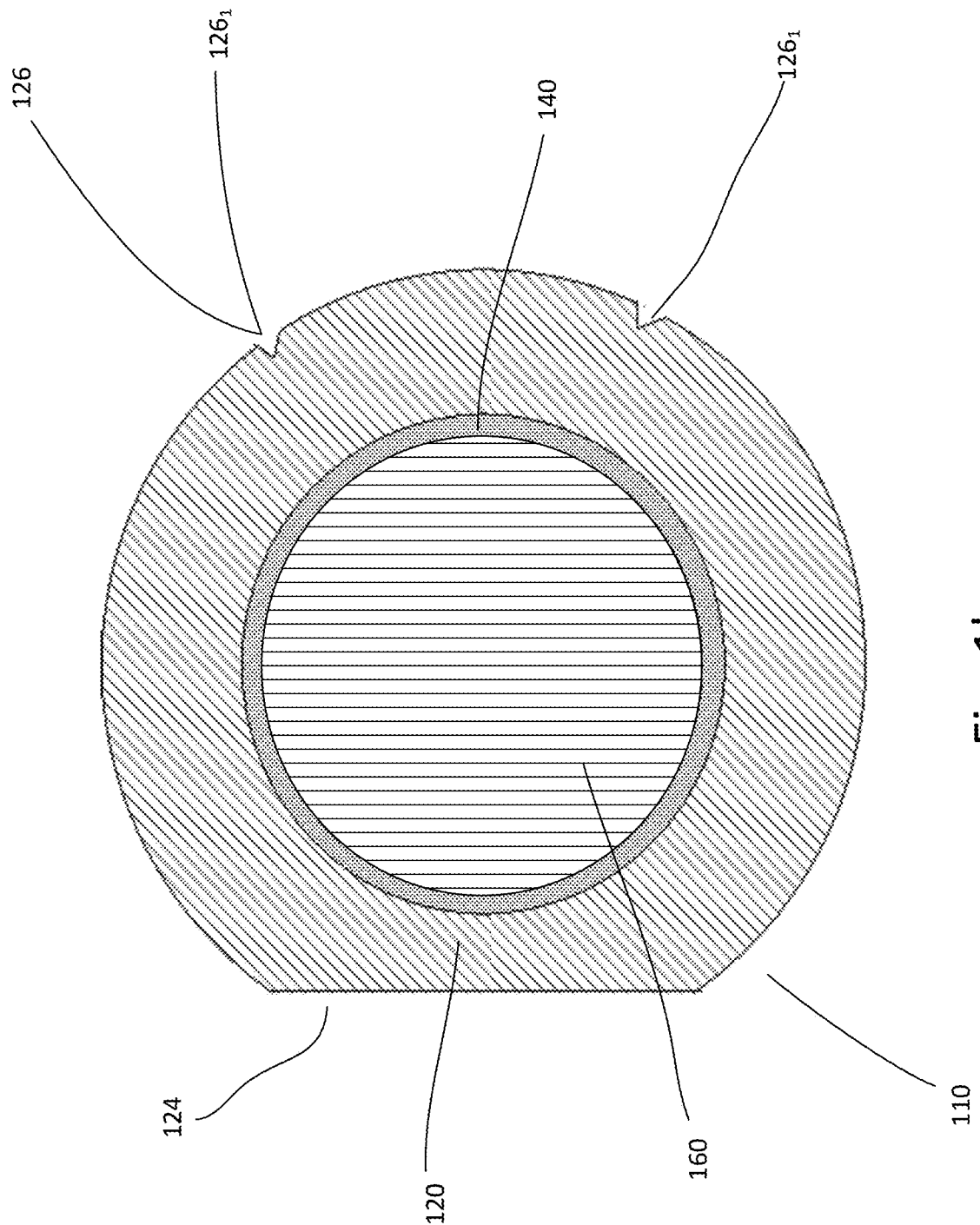

FIGS. 1a-1b show top views of an embodiment of a wafer adaptor ring assembly 110 with and without a wafer. Referring to FIG. 1a, the wafer ring assembly 110 includes a primary ring 120. The primary wafer ring, in one embodiment, is configured to accommodate a wafer having a designated size for plasma dicing by a plasma wafer dicer. The designated sized wafer, for example, may be a 200 nm or a 300 nm wafer. Other sized wafers may also be useful. The primary wafer ring is preferably made of a rigid material. The primary wafer ring is designed to support a wafer for plasma dicing. For example, the primary wafer ring may be formed of metal or alloy. Other types of rigid materials, such as plastic, may also be useful.

The primary wafer ring, in one embodiment, includes inner and outer primary ring edges. The outer primary ring edge forms the circumference of the primary wafer ring. As shown, the outer primary ring edge is circular or substantially circular. The outer edge, in one embodiment, includes primary alignment notches 126. In one embodiment, the outer edge includes at least two alignment notches. For example, the outer edge includes first and second primary alignment notches $126_{1-2}$. The primary alignment notches, as shown, are triangular shaped notches. The primary alignment notches are employed for alignment purposes. Other configurations of the outer primary ring edge, including the shape and alignment notches, may also be useful. For example, other shaped outer edges, shaped notches and the number of notches may also be useful As for the inner primary ring edge, it defines a primary ring opening of the primary wafer ring. The primary ring opening is configured to accommodate the designated sized wafer. In one embodiment, the primary ring opening is a circular shaped opening. Other shaped primary ring openings capable of accommodating a designated sized wafer may also be useful. The shape of the primary ring opening may be according to, for example, industry standards for accommodating a designated sized wafer.

In one embodiment, the outer edge of the primary wafer ring includes a primary flat outer edge 124. The flat edge, for example, facilitates identifying the orientation of the primary wafer ring. For example, the flat edge is used for alignment purposes. Providing other techniques, including the number of flat edges and/or other shaped edges, may also be useful.

In one embodiment, a bottom surface of the primary wafer ring includes an adhesive sheet 141. The adhesive sheet, for example, may be a transparent or translucent adhesive sheet. Other types of adhesive sheets, such as opaque adhesive sheets, may also be useful. An adhesive side of the adhesive sheet is facing the bottom surface of the primary wafer ring. This facilitates the adhesive sheet in adhering to the bottom surface of the primary wafer ring. The adhesive of the adhesive sheet, for example, is sufficient to attach the adhesive sheet to the primary wafer ring. The primary wafer ring and the adhesive sheet may be collectively referred to as a primary ring sub-assembly.

The wafer adaptor ring assembly includes an adaptor ring 140 disposed within at least the inner circumference of the primary ring. For example, the adaptor ring is aligned and placed on the adhesive sheet in the primary ring opening. The adhesive sheet maintains the adaptor ring in position within the primary ring opening. A lamination process may fix the adaptor ring on the adhesive sheet. The lamination process, for example, smoothens the adhesive sheet under the adaptor ring and bonds the adhesive sheet to the adaptor ring.

The adaptor ring is configured to accommodate an adapted sized wafer which is smaller than the designated sized wafer. The adaptor ring accommodates and secures the adapted sized wafer. The adaptor ring may include a single component (part) or multiple components (parts). The adaptor ring may be formed from a rigid material. Preferably, the adaptor ring is formed of a non-conductive material to avoid interfering with the plasma dicing process.

In one embodiment, the adaptor ring reduces the size of the primary ring opening to accommodate the adapted sized wafer. For example, the amount that the primary ring opening is reduced may depend on the size of the opening designed for the designated sized wafer and the adapted sized wafer. The greater the difference in the sizes, the larger the amount that the primary ring opening is reduced; the smaller the difference in the sizes the lesser the amount that the opening is reduced.

In one embodiment, the adaptor ring includes inner and outer adaptor ring edges. The outer adaptor ring edge, in one embodiment, is configured to fit on the inner primary ring edge. For example, the outer adaptor ring edge has a shape and size which is based on the primary ring opening or inner primary ring edge. As shown, the inner primary ring edge is circular. As such, the outer adaptor ring edge is also circular and is about the same size as the inner primary ring edge. As shown, the outer primary ring edge and outer adaptor ring edge are configured to abut each other. For example, no gaps exist between the primary and adaptor rings. In other embodiment, a gap may exist between the primary and adaptor rings.

The inner adaptor ring edge defines an adaptor ring opening 130. The inner adaptor ring edge is configured to accommodate the adapted sized wafer. In one embodiment, the inner adaptor ring edge is circular, forming a circular adaptor ring opening. Other shapes for the inner and outer adaptor ring edges may also be useful. The shapes of the ring edges, for example, may be in accordance with industry standards. The width of the adaptor ring (distance between the inner and outer adaptor ring edges) may depend on the adaptor sized wafer. For example, the width of the adaptor ring is selected to accommodate the adapted sized wafer in the adaptor ring opening. The primary ring, adhesive sheet and adaptor ring, for example, form the wafer adaptor ring assembly.

Referring to FIG. 1b, an adapted sized wafer 160 is mounted onto the wafer adaptor ring assembly 110. The adapted sized wafer, for example, is processed with a plurality of devices. As shown, the outer wafer edge is aligned and mated to the adaptor ring 140. For example, the alignment notches are employed to align the wafer to the adaptor ring opening. The adhesive sheet within the adaptor ring opening secures the wafer in position. A lamination process may be employed to secure the adapted sized wafer on the adhesive sheet. As shown, the adaptor ring and the adapted sized wafer abut each other. For example, no gaps exist between the adaptor ring and adapted sized wafer. In other embodiments, a gap or gaps may exist between the adaptor ring and adapted sized wafer. The wafer adaptor ring assembly with the processed adapted sized wafer is ready for plasma dicing by a plasma dicing chamber designed for plasma dicing a designated sized wafer.

As described, the wafer adaptor ring assembly includes a single component adaptor ring. In addition, there is no gap between the wafer and the adaptor ring and the adaptor ring and the primary ring. Providing other configurations of the adaptor ring assembly may also be useful. For example, the adaptor ring may be a multi-component adaptor ring or there may be gaps between one or more components of the wafer adaptor ring assembly.

Figure 2A:
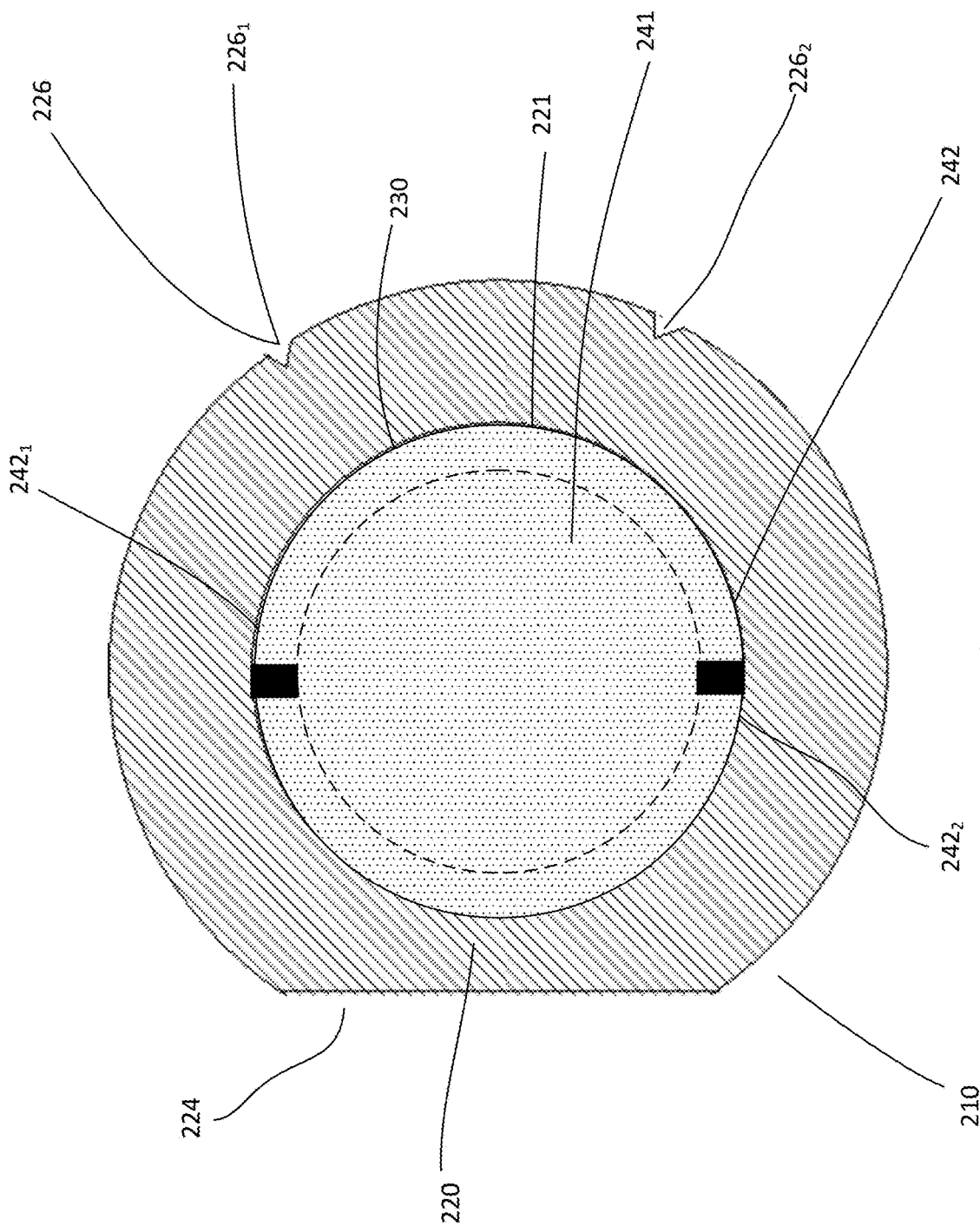
FIGS. 2a-2b show simplified top views of yet another embodiment of a wafer adaptor ring assembly with and without a wafer.
Figure 2B:
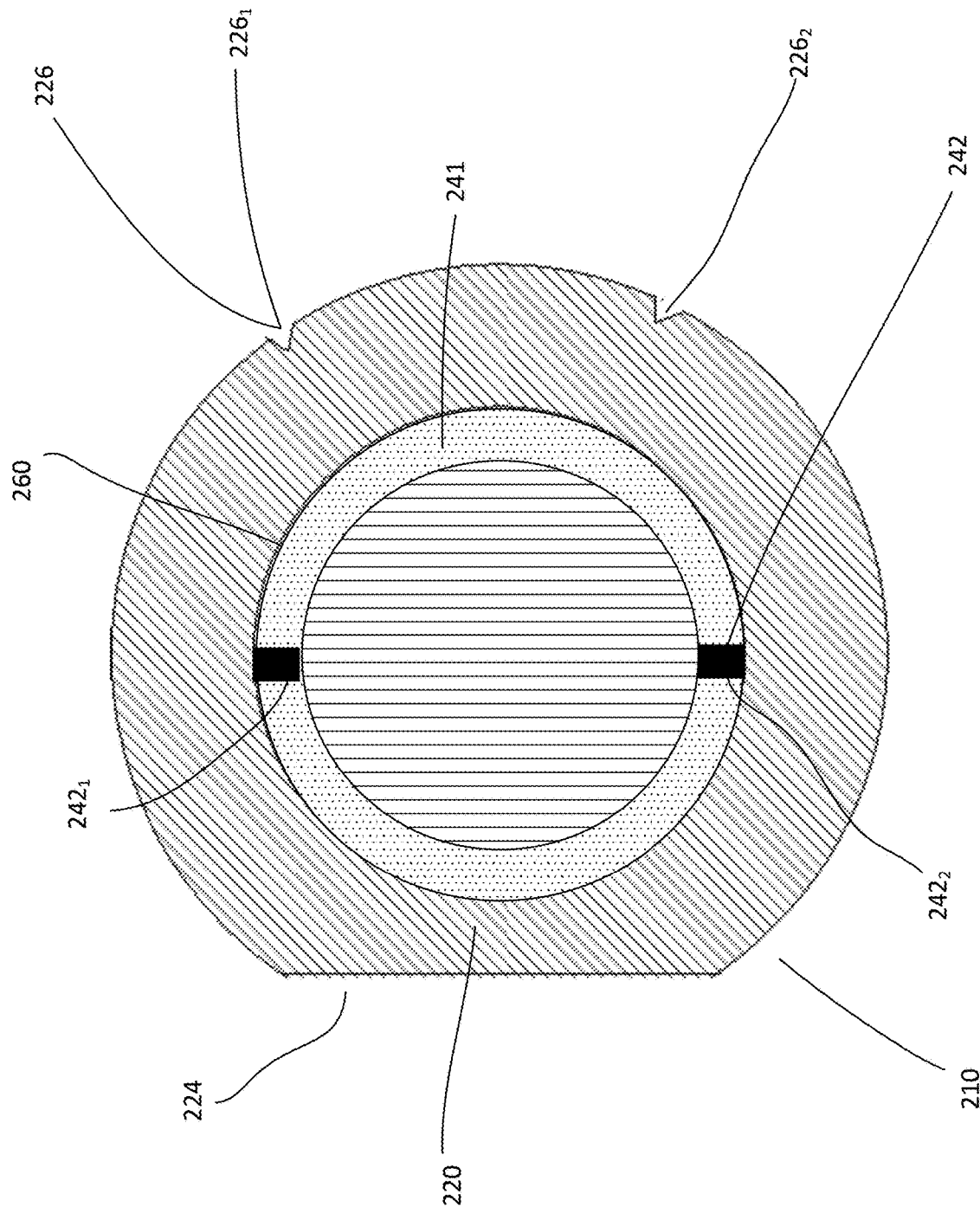

FIGS. 2a-2b show top views of another embodiment of a wafer adaptor ring assembly 210 with and without a wafer. The wafer adaptor ring assembly has similar components to that described in FIGS. 1a-1b. Common components may not be described or described in detail.

In FIG. 2a, the wafer adaptor ring assembly 210 includes a primary wafer ring 220. The primary wafer ring is designed to accommodate a designated sized wafer. The primary wafer ring may have a circular shape defined by an outer primary ring edge. The outer primary ring edge includes a flat edge 224 and alignment notches 226 for alignment and orientation purposes on the outer primary ring edge. For example, the outer primary ring edge includes first and second alignment notches $226_{1-2}$. An inner primary ring edge defines a primary ring opening 221. The primary ring opening is a circular shaped opening. Other configurations of the primary wafer ring may also be useful. In one embodiment, a bottom surface of the primary wafer ring includes an adhesive sheet 241, forming a primary ring sub-assembly.

The wafer adaptor ring assembly includes an adaptor ring disposed within at least the primary ring opening. In one embodiment, the adaptor ring includes wafer locks 242 positioned on the inner primary ring edge for securing an adapted sized wafer. As shown, first and second wafer locks $242_{1-2}$ are positioned on opposing sides of the inner primary ring edge. Providing other numbers of wafer locks may also be useful. For example, the wafer locks may be distributed evenly spaced apart around the inner primary ring edge for securing the adapted sized wafer. The adhesive sheet, for example, maintains the wafer locks in position. The wafer locks are configured to reduce the size of the primary ring opening, creating an adaptor ring opening 230 (within the dotted line).

The wafer locks of the adaptor ring are arranged to lock or secure the adapted sized wafer in position on the adhesive sheet within the adaptor ring opening. The wafer locks, for example, are configured to have an unengaged and engaged mode. In the unengaged mode, the locks do not secure the adapted sized wafer to the primary ring. In the engaged mode, the wafer locks are engaged, securing the adapted sized wafer 260 within the wafer adaptor ring assembly, as shown in FIG. 2b. A lamination process may be employed to attach the adapted sized wafer on the adhesive sheet.

In one embodiment, a wafer lock of the adaptor ring is a mechanical wafer lock. In one embodiment, the wafer lock is in an extended position in the engaged mode and an unextended or retracted position in the unengaged mode. In one embodiment, the normal or unextended (retracted) position enables the locks to serve as a receptacle for the adapted size wafer while the extended position secures the wafer in position. The engaged and unengaged positions may be achieved mechanically. Other techniques for engaging and disengaging the locks may also be useful. In other embodiments, an adapted sized wafer may be positioned on the adhesive sheet in the primary ring. Wafer locks in the unengaged mode may be positioned on the adhesive sheet and engaged to secure the adapted sized wafer in position.

Figure 2C:
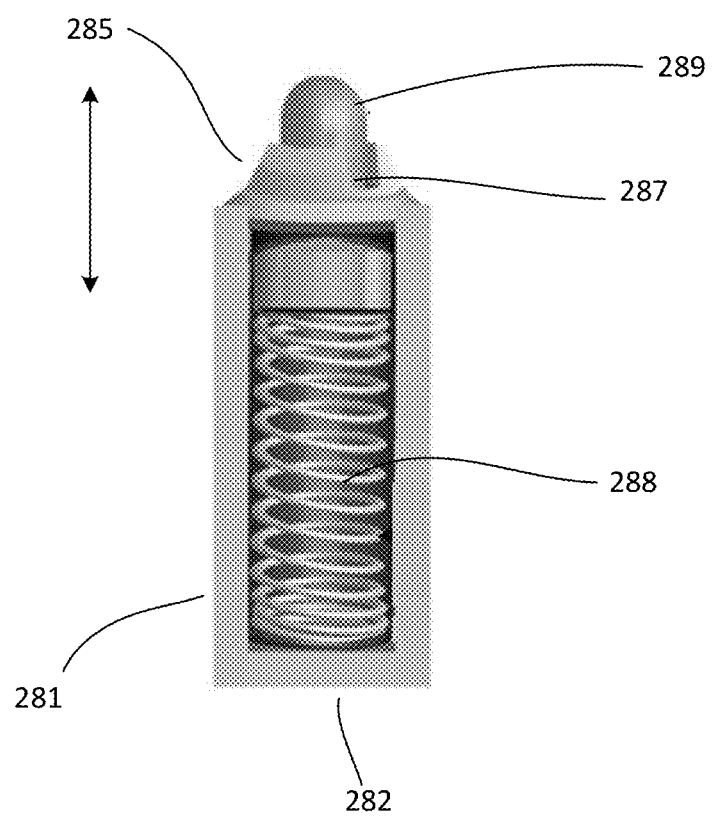
FIG. 2c shows a simplified view of an embodiment of a wafer lock.

FIG. 2c shows a simplified embodiment of a wafer lock 242. As discussed, the wafer lock is configured to be attached to the primary ring edge and operates in an engaged or unengaged mode to position and secure an adapted wafer in position for a wafer adaptor ring assembly. As shown, the wafer lock includes a wafer lock housing 281 for housing an extendable and retractable locker unit for operating in an engaged and unengaged mode.

The lock housing includes a housing body 282 and a housing cap 285. In one embodiment, the housing body is an elongated body with a housing body cavity for housing a mechanically retractable lock. In one embodiment, the bottom of the housing body may be fixed to the inner primary ring edge. The housing body may be fixed to the primary ring by the adhesive sheet.

In one embodiment, the lock unit includes a retractor/extender (extender) 288 and a locker head 289. The locker head, as shown, includes a lock head base and a lock head nub extending from the lock head base. In one embodiment, the extender is a spring which can be compressed mechanically to have a compressed height. When not compressed, the spring is at its normal or extended height. The extender and locker head are contained within the cavity of the housing body by the housing cap. For example, the housing cap includes an opening for the lock head nub to extend through, but the lock head is maintained within the housing body cavity by the lock head base and the housing cap. For example, the length of the lock head nub has a length designed to lock the wafer in position when the spring is in its engaged or extended position and enables the wafer lock to serve as a receptacle for the wafer when in the unengaged position.

In one embodiment, the housing cap is configured to enable locking the nub in the unengaged position and unlocking it to enable it to extend to the engaged position. In one embodiment, the housing cap includes a slot 287 for a nub lock to extend therethrough to lock the tip of the lock head nub in the unengaged position. To engage the wafer lock, the nub lock is retracted from the wafer lock, enabling the nub lock to extend into the engaged position.

FIG. $3a_1$ shows a simplified top view of an embodiment of a wafer adaptor ring assembly 310 without a wafer while FIGS. $3a_2$-$3a_3$ shows simplified cross-sectional views of variants of the wafer adaptor ring assembly across A-A'. The wafer adaptor ring assembly has similar components to that described in FIGS. 1a-1b and 2a-2b. Common components may not be described or described in detail.

Referring to FIGS. $3a_1$-$3a_3$, the wafer ring assembly 310 includes a primary ring 320. The primary wafer ring is designed to accommodate a designated sized wafer. The primary wafer ring may have a substantially circular shape defined by an outer primary ring edge. In one embodiment, the outer primary ring edge has a modified circular shaped outer primary ring edge. In one embodiment, the outer primary ring edge includes a circular edge which is modified by flat edges 324 on four sides thereof. For example, first and second opposing sides and third and fourth opposing sides include flat edges. Adjacent to one of the flat edges, the outer primary ring edge includes alignment notches 326. For example, first and second alignment notches $326_{1-2}$ are located adjacent to one of the flat edges for alignment purposes. In one embodiment, one notch $326_1$ is a v shaped notch while the other notch 3262 is a recessed notch with a flat surface. Providing other shaped notches or configurations of notches may also be useful.

As for the inner primary ring edge, it is configured to accommodate an adaptor ring 341. In one embodiment, the adaptor ring includes inner and outer adaptor ring edges. In one embodiment, the outer adaptor ring edge is similar in shape to the outer primary ring edge. For example, the outer adaptor ring edge has a modified circular shape with flat edges on 4 sides with notches adjacent to one of the flat edges. The inner primary ring edge, in one embodiment, has a shape which complements the shape of the outer adaptor ring edge. For example, the inner primary ring edge is configured to enable the outer adaptor ring edge to fit thereto.

In one embodiment, the inner primary ring edge includes a primary ring recess or a primary ring ledge 322 which extends outwardly away from the inner primary ring sidewall (towards the center of the primary ring). The ledge serves to provide a support ledge for the adaptor ring. This facilitates attaching the adaptor ring to the primary ring. The ledge, for example, is created by machining the primary ring to remove a portion of the inner primary ring edge. For example, a small amount of the inner edge of the primary ring is removed to create the ledge. An adhesive may be employed to maintain the adaptor ring on the primary ring ledge. Other techniques for maintaining the adaptor ring on the primary ring ledge may also be useful.

In one embodiment, as shown in FIG. $3a_2$, the inner primary ring edge of the primary ring 320 and the outer adaptor ring edge of the adaptor ring 341 fit without a gap therebetween. In such cases, due to a lack of a gap, the adaptor ring sits on the ledge and is maintained in position.

In other embodiments, as shown in FIG. $3a_3$, a gap 349 exists between the adaptor ring 341 and the primary ring 320. The gap, for example, is smaller than the length of the ledge. Furthermore, the gap should be sufficiently small to not negatively affect plasma dicing of an adapted sized wafer attached to the wafer adaptor ring assembly. In one embodiment, an adaptor ring lock may be employed to hold the adaptor ring in position on the ledge. The adaptor ring lock, for example, may be similar to the wafer lock described in FIG. 2c. The length of the ring lock is configured to fit between the gap of the primary ring and adaptor ring in the unengaged mode and to secure the adaptor ring in position in the engaged mode. Other types of adaptor ring locks may also be useful. Additionally, other configurations of the primary ring and adaptor ring may also be useful. For example, the inner primary ring edge and outer adaptor ring edge may have other shapes or may have different shapes.

As for the inner adaptor ring edge, it includes a circular shape, defining a circular shaped adaptor ring opening 330. The adaptor ring opening is configured to accommodate an adapted size wafer. Other shapes for the adaptor ring opening may also be useful.

In one embodiment, the adaptor ring includes an adhesive sheet 346. For example, the adaptor ring and adhesive sheet form a multi-component adaptor ring or adaptor ring unit. The adhesive sheet may be attached to the bottom surface of the adaptor ring 341 adjacent to the primary ring ledge 322. For example, the adhesive sheet covers the adaptor ring opening. The adhesive sheet, for example, may be a transparent or translucent adhesive sheet. Other types of adhesive sheets, such as opaque adhesive sheets, may also be useful. An adhesive side of the adhesive sheet is facing the bottom surface of the adaptor ring. This facilitates adhering the adhesive sheet to the adaptor ring. To attach the adhesive sheet to the adaptor ring, a lamination process may be performed.

FIG. $3b_1$ shows a simplified top view of an embodiment of a wafer adaptor ring assembly 310 with an adapted sized wafer 360 while FIGS. $3b_2$-$4b_3$ shows simplified cross-sectional views of variants of the wafer adaptor ring assembly with the adapted sized wafer across A-A'. The wafer adaptor ring assembly has similar components to that described in FIGS. 1a-1b, 2a-2b and $3a_1$-$3a_3$. Common components may not be described or described in detail.

Referring to FIGS. $3b_1$-$3b_3$, the wafer ring assembly 310 includes a primary ring 320 with an adaptor ring unit which includes an adaptor ring 341 with an adhesive sheet 346 laminated to a bottom surface thereof. As shown, the adapted sized wafer 360 is attached to the adhesive sheet within the adaptor ring opening 330.

For example, the wafer is aligned to the adaptor ring opening and positioned on the adhesive sheet therein. The adhesive secures the wafer in position within the adaptor ring opening. In one embodiment, a lamination process is employed to attach the adapted sized wafer to the adhesive sheet. As shown, a gap 362 exists between the wafer and the adaptor ring. The gap may be about 20 mm. Providing gaps between the wafer and adaptor ring having other dimensions may also be useful. Other configurations of the wafer adaptor ring assembly may also be useful.

In one embodiment, the adapted sized wafer is attached to adaptor ring unit with the adhesive sheet. For example, the adapted sized wafer is aligned and attached to the adhesive sheet of the adaptor ring unit. The adaptor ring unit with the adapted sized wafer may be referred to as an adaptor ring sub-assembly. In one embodiment, after the adapted sized wafer is attached to the adaptor ring unit, the adaptor ring sub-assembly is attached to the primary ring. For example, the adaptor ring sub-assembly is aligned to the primary ring and attached to the primary ring ledge.

FIG. 4 shows an embodiment of a simplified process flow 400 for assembling a wafer adaptor ring assembly. The process, at 410, provides a wafer adaptor ring assembly. The wafer adaptor ring assembly may include those described in FIGS. 1a, 2a and $3a_1$-$3a_3$. For example, the wafer adaptor ring assembly includes a primary ring with an adhesive sheet for securing an adapted sized wafer. The adaptor ring may be a single component or a multi-component adaptor ring.

At 420, a processed adapted sized wafer is provided. The processed adapted sized wafer, for example, includes a plurality of semiconductor devices formed thereon. The semiconductor wafer may be a circular wafer. Other shaped wafers may also be useful. For example, the wafer may have a rectangular shape or other polygonal shapes. The wafer may have a vertical wafer sidewall or sidewalls. Other types of sidewalls, such as slanted, or curved sidewalls may also be useful.

The wafer is aligned to the wafer adaptor ring assembly for attachment. For example, the wafer is aligned to the wafer adaptor ring opening of the wafer adaptor ring assembly. Alignment of the wafer, for example, is achieved using the alignment notches. Once aligned, the wafer is positioned in the adaptor ring opening and secured thereto. This results in a wafer ring adaptor assembly with an adapted sized wafer which is ready for plasma dicing.

Other processes may also be employed to assemble the wafer adaptor ring assembly. In other embodiments, a primary wafer with an adhesive sheet may be provided. An adapted sized wafer is aligned in the primary ring opening and attached to the adhesive sheet therein. A lamination process may be employed to attach the adapted sized wafer to the adhesive sheet. An adaptor ring is aligned and attached to the adhesive sheet with the primary ring and adapted sized wafer. A lamination process may be employed to attach the aligned adaptor ring to the adhesive sheet.

In another process, an adaptor ring with an adhesive sheet attached thereto is provided. An adapted sized wafer is aligned and attached to the adhesive sheet within the adaptor ring opening, forming an adaptor ring sub-assembly. The adaptor ring sub-assembly is then aligned to the primary ring, forming the wafer adaptor ring assembly. Depending on the configuration, adaptor ring locks may be employed to secure the adaptor ring sub-assembly to the primary ring.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A wafer adaptor ring assembly for adapting an adapted sized wafer for plasma processing designed for processing a designed sized wafer which is larger than the adapted size wafer, the ring assembly comprises:
    a primary ring having inner and outer primary ring edges, wherein the outer primary ring edge defines a shape of the primary ring and the inner primary ring edge defines a primary ring opening, wherein the primary ring is a closed or continuous primary ring designed to accommodate the designed sized wafer within the primary ring opening;
    an adaptor ring disposed within at least a circumference of the primary ring opening, the adaptor ring includes inner and outer adaptor ring edges, the adaptor ring includes an adaptor ring opening defined by the inner adaptor ring edge, the adaptor ring is a closed or continuous adaptor ring with the adaptor ring opening configured to accommodate the adapted sized wafer which is smaller than the designed sized wafer;
    an adhesive sheet having top and bottom adhesive sheet surface, wherein the top adhesive sheet surface includes an adhesive-coating, the top adhesive surface is attached to at least a bottom adaptor ring surface of the adaptor ring and encompasses the adaptor ring opening, wherein the adhesive coating on the top adhesive sheet surface is configured to hold the adapted sized wafer in position in the wafer adaptor ring assembly for plasma processing.

2. The wafer adaptor ring assembly of claim 1 wherein the outer primary ring edge comprises a substantially circular outer primary ring edge.

3. The wafer adaptor ring assembly of claim 2 wherein the substantially circular outer primary ring edge comprises:
    first and second alignment notches; and
    a first flat surface.

4. The wafer adaptor ring assembly of claim 3 wherein the flat surface is disposed on an opposite side of the first and second alignment notches.

5. The wafer adaptor ring assembly of claim 1 wherein the inner primary ring edge comprises a circular inner primary ring edge to define a circular primary ring opening.

6. The wafer adaptor ring assembly of claim 5 wherein:
    the adaptor ring comprises a circular outer adaptor ring edge and a circular inner adaptor ring edge, the inner adaptor ring edge defines a circular adaptor ring opening for accommodating the adapted sized wafer;
    the top adhesive sheet surface is attached to a bottom surface of the primary ring and is disposed within the primary ring opening; and
    the adaptor ring is disposed on the top adhesive sheet surface.

7. The wafer adaptor ring assembly of claim 6 wherein;
    the outer adaptor ring edge abuts the inner primary ring edge; and
    when the adapted size wafer is disposed on the top adhesive sheet surface in the adaptor ring opening, a size of the adaptor ring opening is configured so that the an outer wafer edge of the adaptor sized wafer abuts the inner adaptor edge.

8. The wafer adaptor ring assembly of claim 1 wherein the adaptor ring comprises a rigid material.

9. The wafer adaptor ring of claim 1 wherein the adaptor ring comprises a nonconductive rigid material.

10. The wafer adaptor ring assembly of claim 1 wherein the top adhesive sheet surface is attached to a bottom surface of the primary ring and encompasses the primary ring opening.

11. The wafer adaptor ring assembly of claim 1 wherein the adaptor ring comprises:
    individual wafer locks positioned on the adhesive tape at the inner primary ring edge; and wherein a wafer lock comprises
        a first unengaged mode, wherein in the unengaged mode, the wafer locks are retracted and a base surface of the wafer lock contacts the inner primary ring edge,
        a second engaged mode, wherein in the engaged mode, the wafer lock is extended so that an extended surface, which is an opposing surface of the base surface of the wafer lock contacts an outer wafer edge of the adapted sized when disposed on the top adhesive tape surface within the primary ring opening.

12. The wafer adaptor ring assembly of claim 11 comprises:
    the adapted sized wafer attached to the top adhesive sheet surface within the primary ring opening; and
    the wafer locks are in the engaged mode to secure the adapted sized wafer in position within the primary ring opening.

13. The wafer adaptor ring assembly of claim 2 wherein the substantially circular outer primary ring edge comprises:
    first and second opposing flat edges;
    third and fourth opposing flat edges; and
    first and second alignment notches disposed adjacent to first and second ends of one of the flat edges.

14. The wafer adaptor ring assembly of claim 13 wherein:
    the first alignment notch comprises a v shaped alignment notch; and
    the second alignment notch comprises a recessed alignment notch with a flat alignment notch surface.

15. The wafer adaptor ring assembly of claim 13 wherein:
    the inner primary ring edge comprises an inner primary ring edge shape similar to the outer primary ring edge;

an inner primary ring ledge extending from a bottom portion of the inner primary ring edge; and the adaptor ring is disposed on the inner primary ring ledge.

16. The wafer adaptor ring assembly of claim 15 wherein;

the outer adaptor ring edge comprises an outer adaptor ring edge having an outer adaptor ring edge shape similar to the inner primary ring edge; and the inner adaptor ring edge comprises a circular shape.

17. The wafer adaptor ring assembly of claim 16 wherein when the adapted size wafer is disposed on the top adhesive sheet surface in the adaptor ring opening, a size of the adaptor ring opening is configured to produce a gap between the inner adaptor ring edge and an outer wafer edge of the adaptor sized wafer.

18. A method of assembling a wafer adaptor ring assembly for plasma processing comprising:

providing a primary ring having inner and outer primary ring edges, wherein the outer primary ring edge defines a shape of the primary ring and the inner primary ring edge defines a primary ring opening, wherein the primary ring is a closed or continuous primary ring designed to accommodate a designed sized wafer within the primary ring opening;

providing an adaptor ring, the adaptor ring includes inner and outer adaptor ring edges, the adaptor ring includes an adaptor ring opening defined by the inner adaptor ring edge, the adaptor ring is a closed or continuous adaptor ring with the adaptor ring opening configured to accommodate an adapted sized wafer which is smaller than the designed sized wafer;

aligning the adaptor ring and placing the adaptor ring onto the primary ring within the primary ring opening, wherein a top adhesive surface with an adhesive coating of an adhesive sheet is attached to at least a bottom surface of the adaptor ring; and wherein the wafer adaptor ring assembly is configured to process the adapted size wafer by plasma processing.

19. A method of forming devices comprising plasma processing of a wafer from which a plurality of devices are formed, the method comprises:

providing a primary ring having inner and outer primary ring edges, wherein the outer primary ring edge defines a shape of the primary ring and the inner primary ring edge defines a primary ring opening, wherein the primary ring is a closed or continuous primary ring designed to accommodate a designed sized wafer within the primary ring opening;

providing an adaptor ring, the adaptor ring includes inner and outer adaptor ring edges, the adaptor ring includes an adaptor ring opening defined by the inner adaptor ring edge, the adaptor ring is a closed or continuous adaptor ring with the adaptor ring opening configured to accommodate an adapted sized wafer which is smaller than the designed sized wafer;

aligning the adaptor ring and placing the adaptor ring onto the primary ring within the primary ring opening, wherein a top adhesive surface with an adhesive coating of an adhesive sheet is attached to at least a bottom surface of the adaptor ring, wherein the primary ring and adaptor ring and adhesive sheet form a wafer adaptor ring assembly for plasma processing;

aligning and placing the adapted size wafer onto the top adhesive sheet surface in the adaptor ring opening; and plasma processing the adapted size wafer with the plurality of devices on the adaptor ring assembly.

20. The wafer adaptor ring assembly of claim 16 wherein a primary-adaptor ring gap exists between the inner primary ring edge and the outer primary ring edge.

* * * * *